(12) United States Patent
Maeshima (10) Patent No.: US 10,742,096 B2
(45) Date of Patent: Aug. 11, 2020

(54) CIRCUIT BOARD, MOTOR DRIVING APPARATUS, AND ELECTRIC POWER STEERING APPARATUS

(71) Applicant: NIDEC ELESYS CORPORATION, Kawasaki-shi, Kanagawa (JP)

(72) Inventor: Osamu Maeshima, Kawasaki (JP)

(73) Assignee: NIDEC ELESYS CORPORATION, Kanagawa (JP)

( * ) Notice: Subject to any disclaimer, the term of this patent is extended or adjusted under 35 U.S.C. 154(b) by 120 days.

(21) Appl. No.: 16/145,482

(22) Filed: Sep. 28, 2018

(65) Prior Publication Data

US 2019/0103787 A1  Apr. 4, 2019

(30) Foreign Application Priority Data

Sep. 29, 2017  (JP) ................................. 2017-189730

(51) Int. Cl.
*H02K 11/33* (2016.01)
*H05K 1/11* (2006.01)
(Continued)

(52) U.S. Cl.
CPC ........... *H02K 11/33* (2016.01); *B62D 5/0406* (2013.01); *B62D 5/0421* (2013.01);
(Continued)

(58) Field of Classification Search
CPC ........ H02K 11/33; H02K 11/27; H02K 11/40; H02K 5/225; H02K 15/12; H02K 2211/03; B62D 5/0406; B62D 5/0421; B62D 5/0463; H05K 1/111; H05K 1/144; H05K 1/181; H05K 5/0017; H05K 5/0047;
(Continued)

(56) References Cited

U.S. PATENT DOCUMENTS

| 2013/0249335 A1* | 9/2013 | Motoda | H02K 11/33 310/71 |
| 2015/0180316 A1* | 6/2015 | Maeshima | B62D 5/0406 310/71 |

(Continued)

FOREIGN PATENT DOCUMENTS

| CN | 105322720 A | 2/2016 |
| CN | 105813921 A | 7/2016 |

(Continued)

*Primary Examiner* — Mohamad A Musleh
(74) *Attorney, Agent, or Firm* — Keating & Bennett (57) ABSTRACT

A circuit board includes a power supply terminal connection assembly supplied with current from an external power supply, a first motor circuit that generates current to be supplied to a first winding, a first motor terminal connection assembly that supplies the current to the first winding from the first motor circuit, a second motor circuit that generates current to be supplied to a second winding, a second motor terminal connection assembly that supplies the current to the second winding from the second motor circuit, a first region, and a second region, in which the power supply terminal connection assembly is in the first region or the second region on a side of one end portion of a border line between the first and the second region, and the first and second motor terminal connection assemblies are on a side of another end portion of the border line.

20 Claims, 6 Drawing Sheets

(51) Int. Cl.
| | |
|---|---|
| *H05K 5/00* | (2006.01) |
| *H02K 11/27* | (2016.01) |
| *H02K 11/40* | (2016.01) |
| *B62D 5/04* | (2006.01) |
| *H05K 1/18* | (2006.01) |
| *H05K 1/14* | (2006.01) |
| *H05K 7/14* | (2006.01) |
| *H02K 5/22* | (2006.01) |
| *H05K 1/02* | (2006.01) |
| *H02K 15/12* | (2006.01) |

(52) U.S. Cl.
CPC ........... *B62D 5/0463* (2013.01); *H02K 11/27* (2016.01); *H02K 11/40* (2016.01); *H05K 1/111* (2013.01); *H05K 1/144* (2013.01); *H05K 1/181* (2013.01); *H05K 5/0017* (2013.01); *H05K 5/0047* (2013.01); *H05K 7/1432* (2013.01); *H02K 5/225* (2013.01); *H02K 15/12* (2013.01); *H02K 2211/03* (2013.01); *H05K 1/0254* (2013.01); *H05K 2201/042* (2013.01); *H05K 2201/093* (2013.01); *H05K 2201/09027* (2013.01); *H05K 2201/10151* (2013.01); *H05K 2201/10166* (2013.01); *H05K 2201/10522* (2013.01)

(58) Field of Classification Search
CPC ............... H05K 7/1432; H05K 1/0254; H05K 2201/042; H05K 2201/09027; H05K 2201/093; H05K 2201/10151; H05K 2201/10166; H05K 2201/10522
See application file for complete search history.

(56) References Cited

U.S. PATENT DOCUMENTS

| | | |
|---|---|---|
| 2016/0036289 A1 | 2/2016 | Kawata et al. |
| 2016/0036296 A1 | 2/2016 | Kabune |
| 2016/0311462 A1 | 10/2016 | Inada et al. |
| 2017/0217481 A1 | 8/2017 | Asao et al. |

FOREIGN PATENT DOCUMENTS

| | | |
|---|---|---|
| CN | 107074268 A | 8/2017 |
| JP | 2016-036244 A | 3/2016 |

\* cited by examiner

CIRCUIT BOARD, MOTOR DRIVING APPARATUS, AND ELECTRIC POWER STEERING APPARATUS

CROSS REFERENCE TO RELATED APPLICATIONS

This application claims the benefit of priority to Japanese Patent Application No. 2017-189730 filed on Sep. 29, 2017. The entire contents of this application are hereby incorporated herein by reference.

BACKGROUND OF THE INVENTION

1. Field of the Invention

The present invention relates to a circuit board, a motor driving apparatus, and an electric power steering apparatus.

2. Description of the Related Art

In recent years, improvement of reliability in vehicles and the like is requested due to increase in social demand for traffic safety and the like. For example, a vehicle having a function or a structure that can overcome a malfunction even when the malfunction occurs in a part of the vehicle is requested. As one measure to respond to this request, parts of the vehicle are provided so that a part that is typically formed by one internal structure has the same two or more internal structures for improvement of reliability. These structures may be herein referred to as "being redundant". When a malfunction of one internal structure is detected, the vehicle is promptly restored to a normal operating state by switching to the other normal internal structure that is redundantly provided. Alternatively, when a malfunction of one internal structure is detected while the two internal structures are operating, the malfunctioning internal structure is degraded and the operation of the other internal structure that is normal is continued. As a result, the reliability of the vehicle is improved.

An electric power steering apparatus that assists the handle operation (steering) of a driver has hitherto been installed in a vehicle. An apparatus having the redundancy has also been proposed for the electric power steering apparatus.

An electric power steering apparatus in Japanese Patent Laid-Open No. 2016-036244 includes two systems of inverters and two systems of motor windings respectively corresponding thereto. The variation in wiring lengths among phases is reduced in a circuit board in which the two systems of inverters are provided, but there is a problem in the variation in wiring lengths among phases when one system is energized. In addition, a current cut-off circuit for each of the phases is not specified.

SUMMARY OF THE INVENTION

According to a preferred embodiment of the present invention, a circuit board is provided on one side in a shaft direction of a motor having three or more phases, and the circuit board controls the motor. The motor includes a stator including at least a first winding and a second winding; a rotor that is rotatable relatively with respect to the stator; and a shaft that rotates with the rotor. The circuit board includes a power supply terminal connection assembly to which current is supplied from an external power supply; a first motor circuit that generates current to be supplied to the first winding from the current supplied to the power supply terminal connection assembly; a first motor terminal connection assembly that supplies the current generated by the first motor circuit to the first winding; a second motor circuit that generates current to be supplied to the second winding from the current supplied to the power supply terminal connection assembly; and a second motor terminal connection assembly that supplies the current generated by the second motor circuit to the second winding. The circuit board includes a first region in which the first motor circuit and the first motor terminal connection assembly are arranged; and a second region in which the second motor circuit and the second motor terminal connection assembly are arranged. The power supply terminal connection assembly is located in the first region or the second region on a side of one end portion of a border line between the first region and the second region and the first motor terminal connection assembly and the second motor terminal connection assembly are arranged on a side of another end portion of the border line.

The circuit board is capable of securing a wide area for an area from the power supply terminal connection assembly side to the motor terminal connection assembly side as mounting portions for the motor circuits.

In the circuit board, the first motor circuit may include at least a switching circuit, the switching circuit may include at least three high-potential-side switching elements and at least three low-potential-side switching elements, the high-potential-side switching elements and the low-potential-side switching elements may be arranged between the power supply terminal connection assembly and the first motor terminal connection assembly, and the high-potential-side switching elements, the low-potential-side switching elements, the power supply terminal connection assembly, and the first motor terminal connection assembly may be disposed in order of the power supply terminal connection assembly, the high-potential-side switching elements, the low-potential-side switching elements, and the first motor terminal connection assembly.

In the circuit board, the first motor circuit may further include a motor current cut-off circuit, the motor current cut-off circuit may include at least three current cut-off switching elements, the current cut-off switching elements may be arranged between the power supply terminal connection assembly and the first motor terminal connection assembly, and the current cut-off switching elements, the high-potential-side switching elements, the low-potential-side switching elements, the power supply terminal connection assembly, and the first motor terminal connection assembly may be disposed in order of the power supply terminal connection assembly, the high-potential-side switching elements, the low-potential-side switching elements, the current cut-off switching elements, and the first motor terminal connection assembly.

In the circuit board, the first motor circuit may further include a current detection circuit, the current detection circuit may include a current detection element, the current detection element may be arranged between the power supply terminal connection assembly and the first motor terminal connection assembly, and the current detection element, the high-potential-side switching elements, the low-potential-side switching elements, the power supply terminal connection assembly, and the first motor terminal connection assembly may be disposed in order of the power supply terminal connection assembly, the high-potential-side switching elements, the low-potential-side switching elements, the current detection element, and the first motor terminal connection assembly.

In the circuit board, the first motor circuit may further include a current detection circuit, the current detection circuit may include a current detection element, the current detection element may be arranged between the power supply terminal connection assembly and the first motor terminal connection assembly, and the current detection element, the current cut-off switching elements, the high-potential-side switching elements, the low-potential-side switching elements, the power supply terminal connection assembly, and the first motor terminal connection assembly may be disposed in order of the power supply terminal connection assembly, the high-potential-side switching elements, the low-potential-side switching elements, the current detection element, the current cut-off switching elements, and the first motor terminal connection assembly.

In the circuit board, the switching circuit, the current detection circuit, and the motor current cut-off circuit can be arranged in the motor circuit as elements of the circuit, and the circuit board can include many elements of which number increases according to redundancy.

In the circuit board, the at least three high-potential-side switching elements may be disposed along a second direction orthogonally intersecting with a first direction that is a direction in which the border line extends, and the at least three low-potential-side switching elements may be disposed along the second direction.

In the circuit board, the at least three current cut-off switching elements may be disposed along a second direction orthogonally intersecting with a first direction that is a direction in which the border line extends.

In the circuit board, the current detection circuit may include at least three of the current detection elements, and the at least three current detection elements may be disposed along a second direction orthogonally intersecting with a first direction that is a direction in which the border line extends.

In the circuit board, the switching circuit, the current detection circuit, and the motor current cut-off circuit can be arranged to be aligned with regularity in the motor circuit as elements of the circuit, and hence the variation in the wiring lengths from the power supply terminal connection assembly to the motor terminal connection assembly are able to be reduced and the variations in the current path lengths are able to be reduced. As a result, the variation in the impedance is able to be reduced.

The circuit board may further include a Ground terminal connection assembly. In circuit board, the power supply terminal connection assembly or the Ground terminal connection assembly may be arranged across the first region and the second region.

The circuit board may further include a Ground terminal connection assembly. In circuit board, one of the power supply terminal connection assembly and the Ground terminal connection assembly may be arranged in one of the first region and the second region, and another of the power supply terminal connection assembly and the Ground terminal connection assembly may be arranged in another of the first region and the second region.

The circuit board may include a plurality of the power supply terminal connection assemblies and a plurality of the Ground terminal connection assemblies.

The circuit board may further include a first signal terminal connection assembly; and a second signal terminal connection assembly. In circuit board, one of the first signal terminal connection assembly and the second signal terminal connection assembly may be arranged in one of the first region and the second region, another of the first signal terminal connection assembly and the second signal terminal connection assembly may be arranged in another of the first region and the second region, and the first signal terminal connection assembly and the second signal terminal connection assembly may face each other across the border line.

A motor driving apparatus may include the circuit board, and a computer that controls at least the first motor circuit and the second motor circuit.

An electric power steering apparatus that assists handle operation of a driver may include a torque sensor to detect a torque due to the handle operation; the above-described motor driving apparatus; and the motor driven by the motor driving apparatus.

The torque ripple of the motor of the electric power steering apparatus is able to be reduced according to the reduction of the variation in the impedance when the switching circuit, the current detection circuit, and the motor current cut-off circuit are arranged to be aligned with regularity in the motor circuit as elements of the circuits in the circuit board of the electric power steering apparatus.

Further, a strange feeling due to torque pulsation felt by the driver through the handle is able to be alleviated because the torque ripple is able to be reduced.

According to preferred embodiments of the present invention, it is possible to provide an electric power steering apparatus with a circuit board capable of reducing a difference in the path length of the current from the power supply to the motor terminal connection assembly for each system and each phase, a circuit board capable of including an interrupting circuit and the like for each phase for each system and each phase, and a motor driving apparatus including the above.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Examples of a circuit board, a motor driving apparatus, and an electric power steering apparatus are described below with reference to the drawings.

Figure 1:
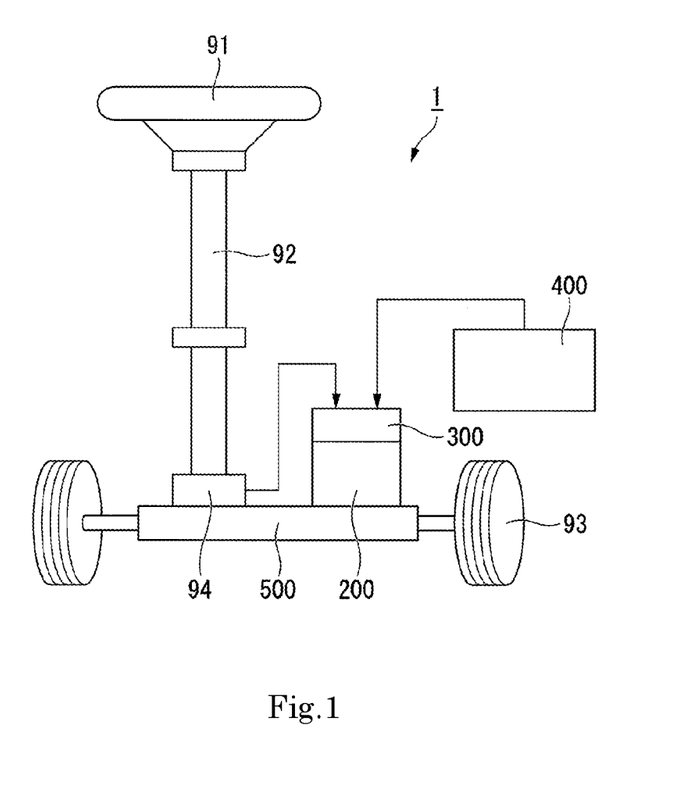
FIG. 1 is a schematic view of an electric power steering apparatus according to a preferred embodiment of the present invention.

FIG. 1 shows a schematic view of the electric power steering apparatus according to a preferred embodiment of the present invention. An electric power steering apparatus 1 is an apparatus that assists the handle operation of a driver in transportation equipment such as an automobile. The electric power steering apparatus 1 of a preferred embodiment of the present invention preferably includes a torque sensor 94, a motor 200, and a motor driving apparatus 300.

The torque sensor 94 is mounted on a steering shaft 92. When the driver rotates the steering shaft 92 by operating a steering wheel (hereinafter also referred to as a "handle") 91, the torque sensor 94 detects a torque applied to the steering shaft 92. That is, the torque sensor 94 detects the torque caused by the handle operation. A torque signal that is a detection signal of the torque sensor 94 is output from the torque sensor 94 to the motor driving apparatus 300. The motor driving apparatus 300 drives the motor 200 on the basis of the torque signal input from the torque sensor 94. Note that the motor driving apparatus 300 may refer to other information (for example, vehicle speed) in addition to the torque signal.

The motor driving apparatus 300 supplies a driving current to the motor 200 with use of the electric power acquired from a power supply source 400. A driving force generated from the motor 200 is transmitted to wheels 93 via a gearbox 500. As a result, the steering angle of the wheels 93 changes. As described above, the electric power steering apparatus 1 changes the steering angle of the wheels 93 by amplifying the torque of the steering shaft 92 by the motor 200. As a result, the driver is able to operate a steering wheel 91 with a light force.

Figure 2:
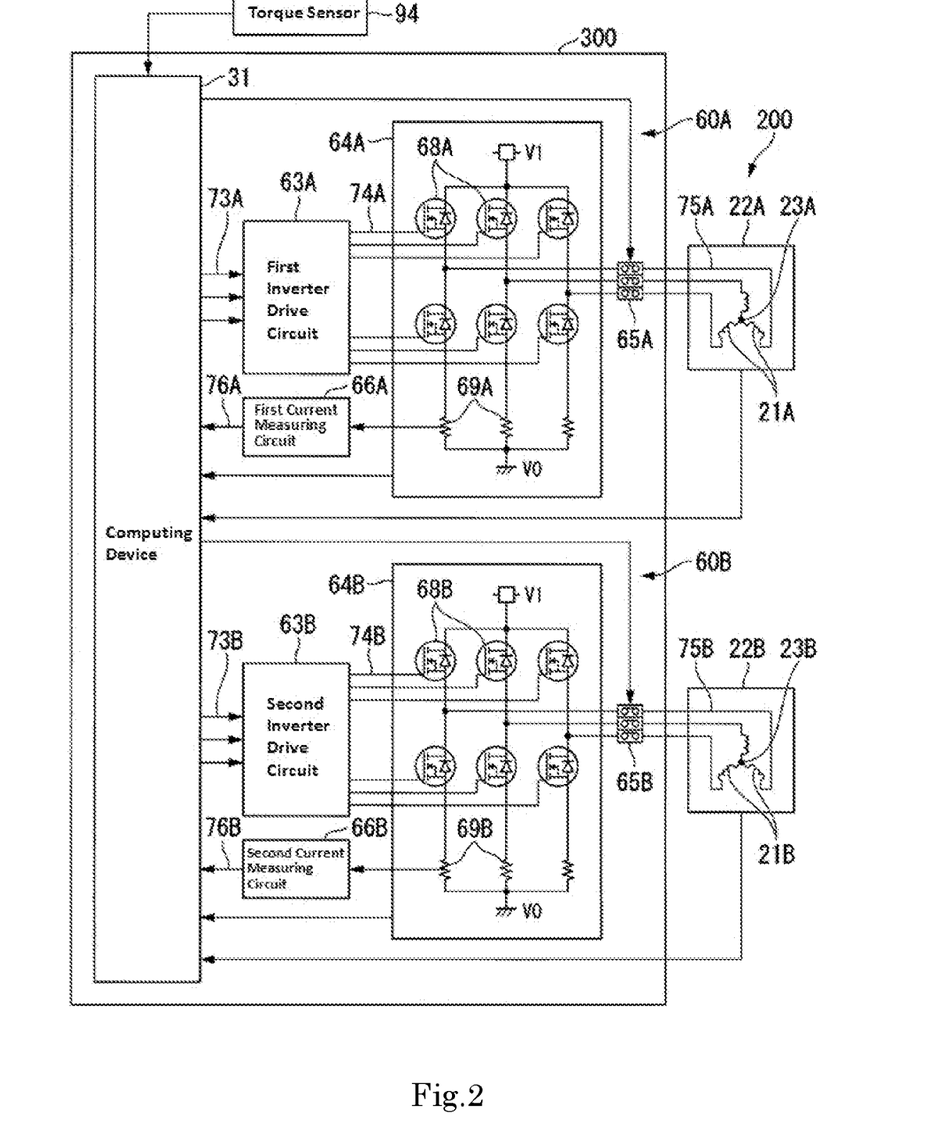
FIG. 2 is a block diagram showing a configuration of a motor driving apparatus according to a preferred embodiment of the present invention.

Next, a configuration of the motor driving apparatus 300 used in the above-described electric power steering apparatus 1 is described. FIG. 2 is a block diagram showing the configuration of the motor driving apparatus 300. As shown in FIG. 2, the motor driving apparatus 300 is defined by an electric circuit including a computing device 31 such as a microcontroller. The motor driving apparatus 300 is electrically connected to the torque sensor 94, the motor 200, and the power supply source 400 (see FIG. 1).

In this preferred embodiment of the present invention, a three-phase synchronous brushless motor is preferably used as the motor 200 of the electric power steering apparatus 1. When the motor 200 is driven, U-phase, V-phase, and W-phase currents are supplied to a plurality of coils 21A and 21B in the motor 200 from the motor driving apparatus 300. Then, a rotating magnetic field is generated between a stator 200A including the coils 21A and 21B and a rotor 200B including a magnet. As a result, the rotor 200B rotates with respect to the stator 200A of the motor 200.

Further, as shown in FIG. 2, the motor 200 of this preferred embodiment of the present invention preferably includes two sets of coil groups defined by U-phase, V-phase, and W-phase coils. The two sets of coil groups are hereinafter referred to as a first coil group 22A and a second coil group 22B. The three coils 21A of the first coil group 22A and the three coils 21B of the second coil group 22B are each connected to each other by star connection. However, each of the first coil group 22A and the second coil group 22B may be connected by a delta connection.

The motor driving apparatus 300 individually supplies the driving current to the first coil group 22A and the second coil group 22B. That is, the motor driving apparatus 300 preferably includes a first control system 60A that supplies the driving current to the first coil group 22A, and a second control system 60B that supplies the driving current to the second coil group 22B.

A first inverter drive circuit 63A is an electric circuit that operates a first inverter 64A. The first inverter drive circuit 63A supplies a PWM signal 74A that is a pulse wave to six first switching elements 68A of the first inverter 64A in accordance with a driving instruction 73A output from the computing device 31. The PWM signal 74A supplied to each of the first switching elements 68A includes a duty ratio designated by the driving instruction 73A.

The first inverter 64A is an electric power converter that generates a driving current 75A on the basis of the PWM signal 74A. As shown in FIG. 2, the first inverter 64A includes the six first switching elements 68A, for example. A transistor such as an FET is used as the first switching element 68A, for example. In the example in FIG. 2, three sets of two first switching elements 68A connected in series are provided in parallel with each other between a power supply voltage V1 and a ground voltage V0.

Ends of the three coils 21A of the first coil group 22A are connected to each other at a neutral point 23A. Further, the other ends of the three coils 21A are connected to connections between the first switching elements 68A on the plus side and the first switching elements 68A on the negative side of the three sets of the first switching elements 68A of the first inverter 64A. When the six first switching elements 68A are turned on or off by the PWM signal 74A, the driving current 75A is supplied to each phase of the coils 21A of the first coil group 22A from the first inverter 64A according to the on or off state thereof.

Further, as shown in FIG. 2, the first inverter 64A preferably includes three first shunt resistors 69A. The three first shunt resistors 69A are interposed between the first switching elements 68A on the negative side of three sets of the first switching elements 68A and the ground voltage V0. When the driving current 75A is supplied to the first coil group 22A, the feedback currents in each phase from the first coil group 22A to the first inverter 64A respectively flow to the three first shunt resistors 69A.

A first motor current cut-off circuit 65A is provided in paths of the currents for the three phases between the first inverter 64A and the first coil group 22A. For example, a mechanical relay or an FET is used as the first motor current cut-off circuit 65A. The first motor current cut-off circuit 65A can switch the path of the current between an energized state and a cutoff state for each phase on the basis of a signal from the computing device 31.

A first current measuring circuit 66A is an electric circuit that measures the current flowing through the first shunt resistors 69A. By measuring a potential difference between both ends of the three first shunt resistors 69A, the first current measuring circuit 66A generates a detection signal 76A indicating a current (shunt current) flowing through each of the first shunt resistors 69A. The generated detection signal 76A is sent to the computing device 31 from the first current measuring circuit 66A. The second control system 60B preferably has a configuration equivalent to that of the first control system 60A. That is, as shown in FIG. 2, the second control system 60B includes a second inverter drive circuit 63B, a second inverter 64B, a second motor current cut-off circuit 65B, and a second current measuring circuit 66B. The second control system 60B supplies a driving current 75B to the second coil group 22B by operating those units. Note that the detailed operation of the units in the second control system 60B are similar to that of the first control system 60A, and hence overlapping descriptions thereof are omitted. In FIG. 2, the signals exchanged among the units in the second control system 60B are denoted by characters 73B to 76B corresponding to the driving instruction 73A, the PWM signal 74A, the driving current 75A, and the detection signal 76A exchanged among the units in the first control system 60A.

Figure 3:
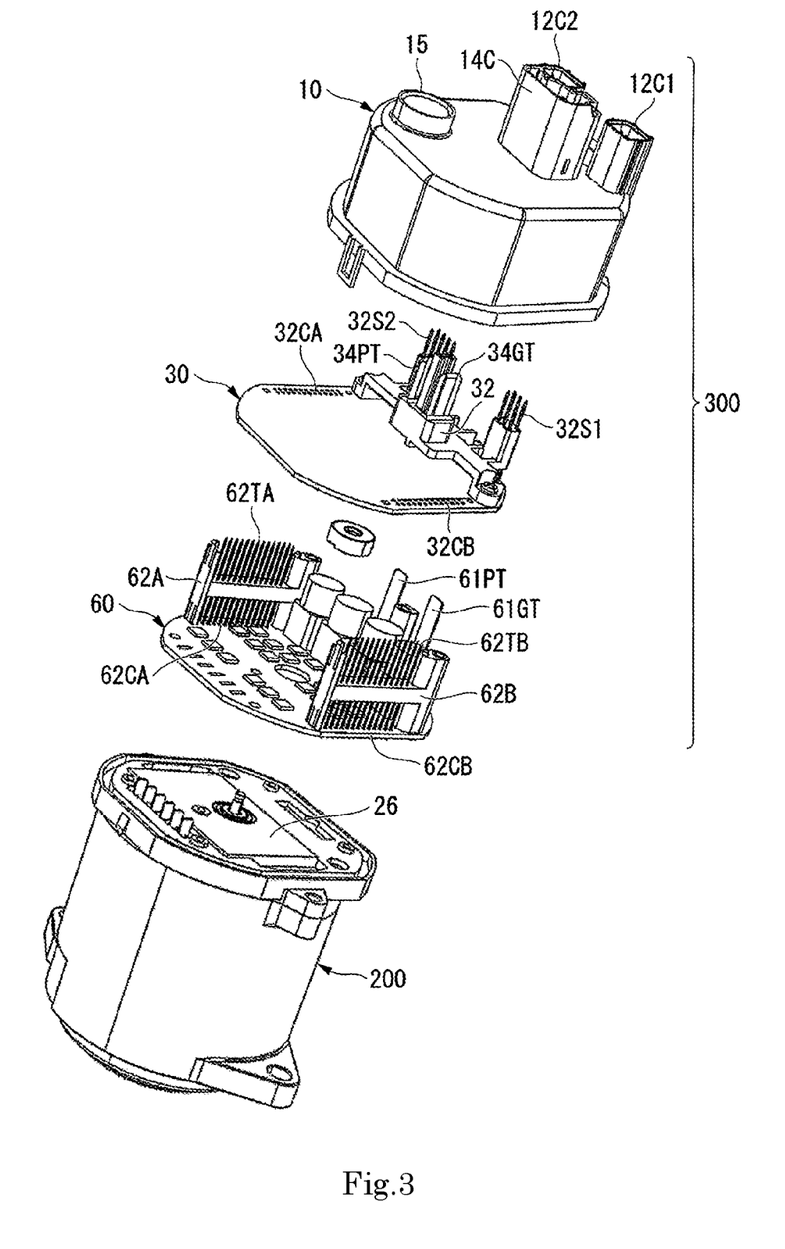
FIG. 3 is an exploded perspective view of the motor driving apparatus.

FIG. 3 is an exploded perspective view of the motor driving apparatus 300 and the motor 200 used in the electric power steering apparatus 1. As shown in FIG. 3, the motor driving apparatus 300 preferably includes a resin case 10 that is integrally molded with at least an external power supply connector 14C to which the power supply source 400 is connected, a first external signal connector 12C1 to which an external signal is connected, and a second external signal connector 12C2, a control board 30 on which at least the computing device 31 is mounted, and a power board (circuit board) 60 on which at least the first inverter 64A and the second inverter 64B are mounted. The resin case 10 covers the control board 30 and the power board 60, and blocks one surface of the motor 200 that is opposite to the output side in a shaft direction. An opening in the resin case 10 and the side of the motor 200 opposite to the output side in the shaft direction are preferably sealed by an adhesive or the like. The motor driving apparatus 300 is made waterproof by the sealing. Note that a breathing hole 15 including a filter is preferred to be provided on the resin case 10. A pressure change in the motor driving apparatus 300 due to temperature change can be suppressed by providing the breathing hole 15. Further, the control board 30 and the power board 60 are preferred to be printed circuit mounting boards. Costs are able to be reduced in comparison to metal substrates of aluminum and the like by using the printed circuit mounting boards.

The power supply source 400 is connected to an external power supply terminal 34PT and an external Ground terminal 34GT arranged in the external power supply connector 14C. The external power supply terminal 34PT and the external Ground terminal 34GT are insert-molded with a first external signal terminal 32S1 and a second external signal terminal 32S2 by resin as the external signal terminal module 32. The external signal terminal module 32 is fixed to a first signal terminal module 62A and a second signal terminal module 62B across the control board 30 by a plurality of fixing members. The plurality of fixing members are a plurality of screws, for example. End portions of the first external signal terminal 32S1 and the second external signal terminal 32S2 on the control board 30 side are electrically connected to the control board 30 by soldering, for example. End portions of the external power supply terminal 34PT and the external Ground terminal 34GT on the control board 30 side are soldered and electrically connected to a power supply terminal 61PT and a Ground terminal 61GT. Note that the connection may be performed through welding, the external power supply terminal 34PT and the power supply terminal 61PT may be integrally provided, and the external Ground terminal 34GT and the Ground terminal 61GT may be integrally provided. Note that the signals of the first external signal terminal 32S1 and the second external signal terminal 32S2 are a torque sensor signal or a signal for CAN communication, for example.

At least one computing device 31 (not shown in FIG. 3) is mounted on the control board 30. In the mounting, surface mounting by reflow soldering is preferred. The computing device 31 is preferably a CPU, for example, and may be a plurality of CPUs. A plurality of signals of the computing device 31 are connected to circuit patterns defined on the control board 30 and are led to a first signal terminal connection assembly 32CA and a second signal terminal connection assembly 32CB. Ends of a plurality of first signal terminals 62TA and second signal terminals 62TB on the control board 30 side are preferably press fit, for example, and are electrically connected to the first signal terminal connection assembly 32CA and the second signal terminal connection assembly 32CB on the control board 30 from the power board 60 side. Note that the connection may alternatively be performed through soldering if so desired.

The control board 30 is sandwiched between the external signal terminal module 32 and the first and second signal terminal modules 62A and 62B and fixed together by the plurality of fixing members.

At least the first inverter 64A and the second inverter 64B are mounted on the power board 60. The plurality of first signal terminals 62TA and second signal terminals 62TB are insert-molded by resin as the first signal terminal module 62A and the second signal terminal module 62B. The other ends of the plurality of signal terminals of the first signal terminal module 62A and the second signal terminal module 62B on the power board 60 side are preferably press fit and electrically connected to a power board first signal terminal connection assembly 62CA and a power board second signal terminal connection assembly 62CB. Note that the connection may alternatively be performed through soldering, if so desired. Further, the power board 60 is fixed to the first signal terminal module 62A and the second signal terminal module 62B by a plurality of fixing members. The plurality of fixing members are a plurality of screws, for example. The signal of the computing device 31 can control the first inverter 64A and the second inverter 64B by electrically connecting the control board 30 and the power board 60 to the first signal terminals 62TA and the second signal terminals 62TB. Further, the computing device 31 may be arranged on the power board 60. The six first switching elements 68A of the first inverter 64A, the six second switching elements 68B of the second inverter 64B, the first shunt resistors 69A as a first current detection circuit, second shunt resistors 69B as a second current detection circuit, the first motor current cut-off circuit 65A, the second motor current cut-off circuit 65B, and other mounted components are preferred to be surface-mounted by reflow soldering when mounted on the power board 60. Note that the other mounted components, for example, a capacitor and a coil for noise reduction, a switching element or a relay for protection when the power supply is cut off or reverse connection of the power supply occurs, and a power supply IC that generates voltage to be supplied to the CPU are also preferred to be surface-mounted by reflow soldering when mounted on the power board 60.

The power board 60 is fixed on one surface of the motor 200 by a plurality of fixing members on the side opposite to the output side in the shaft direction. The plurality of fixing members are a plurality of screws, for example.

The power supply supplied from the power supply terminal 61PT and the Ground terminal 61GT is rectified by a noise reducing capacitor and the like and are connected to a first region and a second region.

Figure 4:
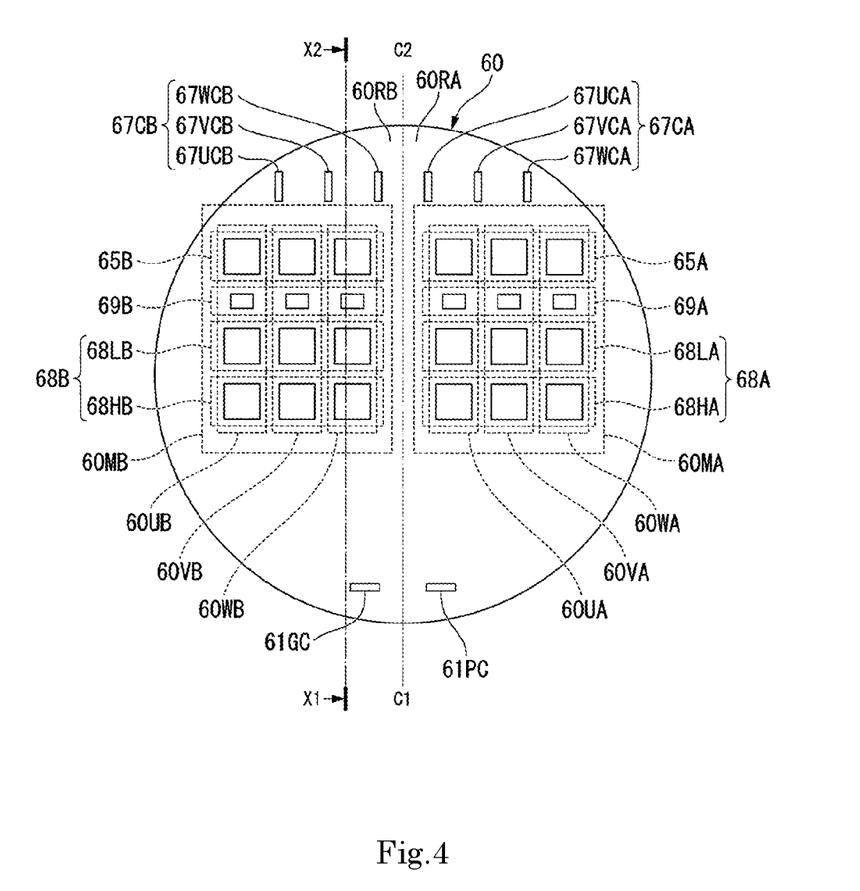
FIG. 4 is a schematic view of a circuit board (a power board) according to a preferred embodiment of the present invention.

FIG. 4 is a schematic view of the power board (circuit board) 60 used in the motor driving apparatus 300. As shown in FIG. 4, the power board 60 preferably includes at least a first region 60RA arranged on one side of a border line C1-C2 in the board and a second region 60RB arranged on the other side. The border line C1-C2 extends from one end portion of the power board 60 (the lower side in FIG. 4) to the other end portion of the power board 60 (the upper end in FIG. 4) through an area between a power supply terminal connection assembly 61PC and a Ground terminal connection assembly 61GC and an area between a first motor terminal connection assembly 67CA and a second motor terminal connection assembly 67CB. A direction in which the border line C1-C2 extends is referred to as a first direction, and a direction orthogonally intersecting with the first direction is referred to as a second direction. In the first region 60RA, a first motor circuit 60MA and the first motor terminal connection assembly 67CA are arranged. In the second region 60RB, a second motor circuit 60MB and the second motor terminal connection assembly 67CB are arranged. On the side of one end portion (the lower side in FIG. 4) of the border line C1-C2, the power supply terminal connection assembly 61PC is located in the first region 60RA and the Ground terminal connection assembly 61GC is located in the second region 60RB. On the side of the other end portion (the upper end in FIG. 4) of the border line C1-C2, the first motor terminal connection assembly 67CA is located in the first region 60RA and the second motor terminal connection assembly 67CB is located in the second region 60RB.

In this preferred embodiment of the present invention, the power board 60 secures a large area for an area from the side of the power supply terminal connection assembly 61PC or the Ground terminal connection assembly 61GC to the side of the first motor terminal connection assembly 67CA or the second motor terminal connection assembly 67CB as mounting portions for the first motor circuit 60MA and the second motor circuit 60MB.

The first motor circuit 60MA at least includes a first switching circuit including the plurality of first switching elements 68A. The first switching circuit includes at least three high-potential-side switching elements 68HA and at least three low-potential-side switching elements 68LA as the first switching elements 68A. In the first region 60RA, the first switching circuit and the first motor terminal connection assembly 67CA are disposed in the order of the first switching circuit and the first motor terminal connection assembly 67CA in the first direction from the side of the power supply terminal connection assembly 61PC or the Ground terminal connection assembly 61GC. That is, in the first switching circuit, at least three high-potential-side switching elements 68HA and at least three low-potential-side switching elements 68LA are disposed in the order of the at least three high-potential-side switching elements 68HA and the at least three low-potential-side switching elements 68LA in the first direction from the side of the power supply terminal connection assembly 61PC or the Ground terminal connection assembly 61GC.

Transistors such as MOS-FETs are preferably used as the first switching elements 68A, for example. Alternatively, elements such as IGBTs may be used if so desired.

Further, the first motor circuit 60MA includes the first motor current cut-off circuit 65A. The first motor current cut-off circuit 65A includes at least three current cut-off switching elements. In the first region 60RA, the first switching circuit, the first motor current cut-off circuit 65A, and the first motor terminal connection assembly 67CA are disposed in the order of the first switching circuit, the first motor current cut-off circuit 65A, and the first motor terminal connection assembly 67CA in the first direction from the side of the power supply terminal connection assembly 61PC or the Ground terminal connection assembly 61GC.

Transistors such as MOS-FETs may preferably be used as the current cut-off switching element, for example. Alternatively, a mechanical relay and the like may be used if so desired.

Further, the first motor circuit 60MA includes the first shunt resistor 69A that defines and functions as the first current detection circuit. The first current detection circuit includes at least three first shunt resistors 69A as current detection elements. In the first region 60RA, the first switching circuit, the first current detection circuit, the first motor current cut-off circuit 65A, and the first motor terminal connection assembly 67CA are disposed in the order of the first switching circuit, the first current detection circuit, the first motor current cut-off circuit 65A, and the first motor terminal connection assembly 67CA in the first direction from the side of the power supply terminal connection assembly 61PC or the Ground terminal connection assembly 61GC.

Elements such as current sensors may be alternatively used as the current detection elements instead of the first shunt resistors 69A if so desired.

The first current detection circuit may include only one current detection element.

In the power board 60, at least the first switching circuit (first switching elements 68A), the first current detection circuit (first shunt resistors 69A), and the first motor current cut-off circuit 65A is located in the first motor circuit 60MA as elements of a three-phase circuit, and the power board 60 can include many elements of which number increases according to redundancy.

Note that the arrangement of the second region 60RB is similar to that of the first region 60RA, and hence overlapping descriptions thereof are omitted. In FIG. 4, a final character B that is a character corresponding to a final character A of the characters for each unit in the first region 60RA is affixed to the characters for each unit in the second region 60RB.

The second current detection circuit in the second region 60RB may include only one current detection element.

In the first motor circuit 60MA, at least three high-potential-side switching elements 68HA are disposed along the second direction and at least three low-potential-side switching elements 68LA are disposed along the second direction.

Further, in the first motor circuit 60MA, at least three current cut-off switching elements defining the first motor current cut-off circuit 65A are disposed along the second direction.

Further, in the first motor circuit 60MA, at least three first shunt resistors 69A as the current detection elements are disposed along the second direction.

In the first motor circuit 60MA, a U-phase current path 60UA, a V-phase current path 60VA, and a W-phase current path 60WA extend in parallel in the first direction. Similarly, in the second motor circuit 60MB, a U-phase current path 60UB, a V-phase current path 60VB, and a W-phase current path 60WB extend in parallel in the first direction.

In the power board 60, at least the first switching circuit (first switching elements 68A), the first current detection circuit (first shunt resistors 69A), and the first motor current cut-off circuit 65A are preferably arranged to be aligned with regularity in the first motor circuit 60MA as elements of the three-phase circuit, and hence the variations in the wiring lengths for the phases from the power supply terminal connection assembly 61PC to the first motor terminal connection assembly 67CA are able to be reduced and the variations in the current path lengths for the phases are able to be reduced. As a result, the variations in the impedance are able to be reduced. In addition, the torque ripple of the motor 200 of the electric power steering apparatus 1 is able to be reduced according to the reduction of the variation in the impedance.

Further, a strange feeling due to torque pulsation felt by the driver through the handle is able to be alleviated because the torque ripple is able to be reduced.

Note that the second motor circuit 60MB is similar to the first motor circuit 60MA, and hence overlapping descriptions thereof are omitted. In FIG. 4, a final character B that is a character corresponding to a final character A of the characters for each unit in the first motor circuit 60MA is affixed to the characters for each unit in the second motor circuit 60MB.

The power supply terminal 61PT is preferably soldered and electrically connected to the power supply terminal connection assembly 61PC. Similarly, the Ground terminal 61GT is preferably soldered and electrically connected to the Ground terminal connection assembly 61GC. The power supply terminal connection assembly 61PC or the Ground terminal connection assembly 61GC may be arranged across the first region 60RA and the second region 60RB.

As shown in FIG. 4, the power supply terminal connection assembly 61PC may be arranged in the first region 60RA and the Ground terminal connection assembly 61GC may be arranged in the second region RB.

A plurality of the power supply terminal connection assemblies 61PC may be provided and a plurality of the Ground terminal connection assemblies 61GC may be provided on the circuit board 60. By this configuration, the power supply can be supplied to the circuit board 60 not only from the power supply source 400 but also from other power supply sources, and power supply supplying paths can be redundant.

The power supply terminal connection assembly 61PC and the Ground terminal connection assembly 61GC are preferably connected to the first motor circuit 60MA and the first motor terminal connection assembly 67CA in the first region 60RA and are preferably connected to the second motor circuit 60MB and the second motor terminal connection assembly 67CB in the second region 60RB.

The power board (circuit board) 60 further includes the power board first signal terminal connection assembly 62CA (see FIG. 3) and the power board second signal terminal connection assembly 62CB (see FIG. 3). The power board first signal terminal connection assembly 62CA is located in the first region 60RA. The power board second signal terminal connection assembly 62CB is located in the second region 60RB. The power board first signal terminal connection assembly 62CA and the power board second signal terminal connection assembly 62CB face each other across the border line C1-C2 (see FIG. 4).

The power board first signal terminal connection assembly 62CA is arranged on a portion of the first region 60RA that is opposite to the border line C1-C2 (that is, on an end portion of the power board 60 and not on a central part thereof). The power board second signal terminal connection assembly 62CB is arranged on a part of the second region 60RB that is opposite to the border line C1-C2. Further, the first signal terminal module 62A connected to the power board first signal terminal connection assembly 62CA and the second signal terminal module 62B connected to the power board second signal terminal connection assembly 62CB also function to fix the power board 60 and the control board 30 together. In this configuration, the number of components is able to be reduced because signals are able to be sent and received between the power board 60 and the control board 30.

Further, a cost reduction effect is obtained because the first signal terminal module 62A and the second signal terminal module 62B are preferably components having the same structure.

Further, the first signal terminals 62TA are signal terminals of the first motor circuit 60MA. The second signal terminals 62TB are signal terminals of the second motor circuit 60MB. By providing each signal terminal, signals from the computing device 31 of the control board 30 are supplied to the first motor circuit 60MA via the first signal terminals 62TA and are supplied to the second motor circuit 60MB via the second signal terminals 62TB. That is, wiring from the computing device 31 of the control board 30 to the first motor circuit 60MA and the second motor circuit 60MB becomes easier by providing the first signal terminals 62TA and the second signal terminals 62TB. That is, wiring across the border line C1-C2 between the first region 60RA and the second region 60RB is able to be reduced, and hence other components are able to be arranged near the border line C1-C2.

The first motor terminal connection assembly 67CA preferably includes a U-phase motor terminal connection assembly 67UCA, a V-phase motor terminal connection assembly 67VCA, and a W-phase motor terminal connection assembly 67WCA. The other ends of the three coils 21A of the first coil group 22A of the motor 200 are soldered and electrically connected to the first motor terminal connection assembly 67CA. Similarly, the second motor terminal connection assembly 67CB preferably includes a U-phase motor terminal connection assembly 67UCB, a V-phase motor terminal connection assembly 67UCB, and a W-phase motor terminal connection assembly 67WCB. The other ends of the three coils 21B of the second coil group 22B of the motor 200 are soldered and electrically connected to the second motor terminal connection assembly 67CB.

Figure 5A:
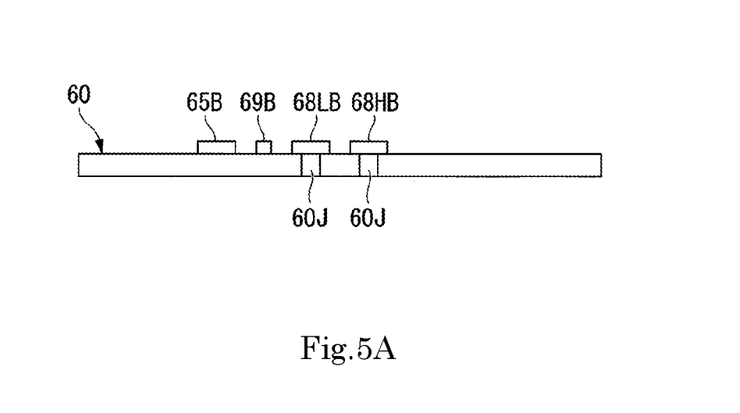
FIG. 5A shows an example of a cross-sectional view of the circuit board in FIG. 4.

FIG. 5A is a cross-sectional view of the power board 60 taken along line X1-X2 in FIG. 4. As shown in FIG. 5A, high-potential-side switching elements 68HB, low-potential-side switching elements 68LB, a second shunt resistors 69B, and a second motor current cut-off circuit 65B are arranged on an upper surface of the power board 60.

The temperature of the high-potential-side switching elements 68HB and the low-potential-side switching elements 68LB increases in response to heat generation due to switching loss, and hence a heat radiating path 60J that radiates heat to a lower surface of the power board 60 is provided in the power board 60. The heat radiating path 60J is preferably a copper inlay or a through hole, for example. The lower surface of the power board 60 is connected to an aluminum plate 26 (see FIG. 3) of the motor 200. An insulating heat radiating member is arranged between the lower surface of the power board 60 and the aluminum plate 26. The heat radiating member may be a heat radiating compound or may be a heat radiating sheet, for example. The heat from the heat generation due to switching loss is radiated from the motor 200 through the aluminum plate 26. The heat radiating path may also be arranged in a portion of the power board 60 on which the second shunt resistors 69B are arranged and a portion where the second motor current cut-off circuit 65B is arranged. Further, a similar heat radiating path may be arranged not only in the second motor circuit 60MB but also on the first motor circuit 60MA side.

Figure 5B:
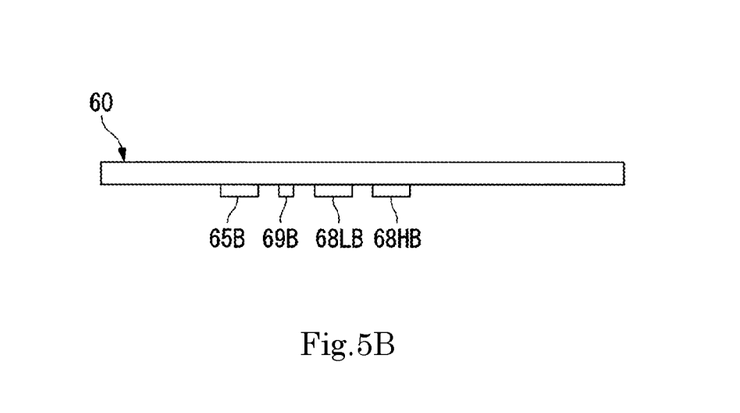
FIG. 5B shows an example of a cross-sectional view of the circuit board in FIG. 4 according to another preferred embodiment of the present invention.

FIG. 5B shows another preferred embodiment of a cross-sectional view of the power board 60 taken along line X1-X2 in FIG. 4. As shown in FIG. 5B, the high-potential-side switching elements 68HB, the low-potential-side switching elements 68LB, the second shunt resistors 69B, and the second motor current cut-off circuit 65B are preferably arranged on the lower surface of the power board 60.

The temperature of the high-potential-side switching elements 68HB and the low-potential-side switching elements 68LB increases in response to heat generation due to switching loss. Rear surfaces (surfaces on the opposite side of board mounting surfaces) of the high-potential-side switching elements 68HB and low-potential-side switching elements 68LB and the aluminum plate 26 of the motor 200 are connected to each other. An insulating heat radiating member is arranged between the high-potential-side switching elements 68HB and the aluminum plate 26, and between the low-potential-side switching elements 68LB and the aluminum plate 26. The heat radiating member may be a heat radiating compound or may be a heat radiating sheet, for example. The heat from the heat generation due to switching loss is radiated from the motor 200 through the aluminum plate 26. The heat radiating member may be arranged in portions in which the second shunt resistors 69B and the second motor current cut-off circuit 65B of the power board 60 are arranged. Further, a similar heat radiating member may be arranged not only in the second motor circuit 60MB but also on the first motor circuit 60MA side.

Figure 6:
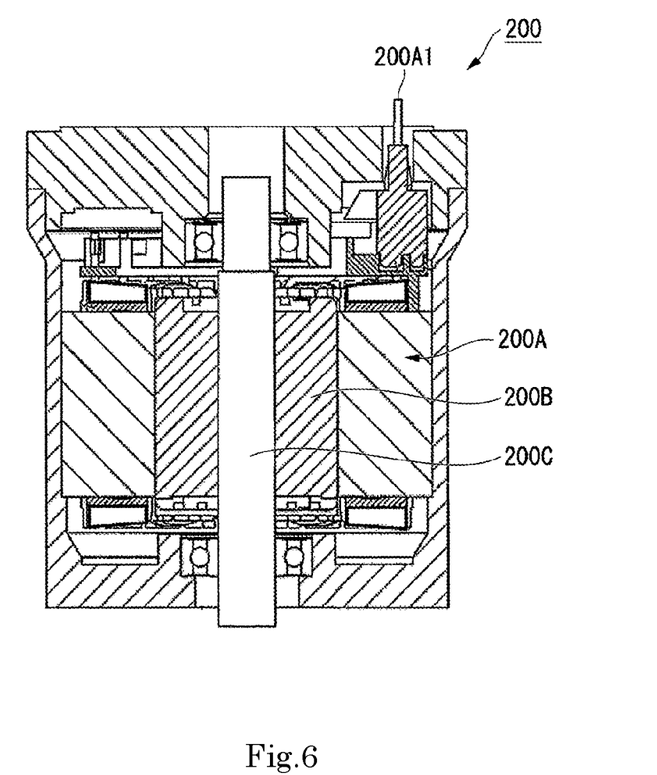
FIG. 6 is a view for describing an internal structure of a motor shown in FIG. 3.

FIG. 6 is a view for describing an internal structure of the motor 200 illustrated in FIG. 3. The motor 200 includes the stator 200A, the rotor 200B provided to be able to rotate relatively with respect to the stator 200A, and a shaft 200C that rotates with the rotor 200B. The power board 60 shown in FIG. 3 and FIG. 4 is preferably provided on one side (the upper side in FIG. 6) of the motor 200 in the shaft direction and controls the motor 200. The stator 200A includes at least a first winding 200A1 and a second winding. Only the first winding 200A1 is shown in the cross section shown in FIG. 6, but the second winding exists in a cross section, which is different from the cross section shown in FIG. 6 and which includes a central axis line of the motor 200. If the cross section is to be shown, the cross section is a cross-sectional view that is practically similar to the cross-sectional view shown in FIG. 6.

Current generated by the first motor circuit 60MA of the power board 60 is supplied to the first winding 200A1 via the first motor terminal connection assembly 67CA. Current generated by the second motor circuit 60MB of the power board 60 is supplied to the second winding via the second motor terminal connection assembly 67CB.

As shown in FIG. 4, the power board 60 preferably includes the power supply terminal connection assembly 61PC to which current is supplied from the power supply source 400 (see FIG. 1), the motor circuits (the first motor circuit 60MA and the second motor circuit 60MB) that generate current to be supplied to the stator 200A from the current supplied to the power supply terminal connection assembly 61PC, and the motor terminal connection assemblies (the first motor terminal connection assembly 67CA and the second motor terminal connection assembly 67CB) that supply the current generated by the motor circuits to the stator 200A. The power supply terminal connection assembly 61PC and the motor terminal connection assemblies (the first motor terminal connection assembly 67CA and the second motor terminal connection assembly 67CB) are arranged on the end portions of the circuit board 60. The power supply terminal connection assembly 61PC faces the motor terminal connection assemblies (the first motor terminal connection assembly 67CA and the second motor terminal connection assembly 67CB) across a central portion of the circuit board 60.

As shown in FIG. 4, the motor circuits (the first motor circuit 60MA and the second motor circuit 60MB) at least include the switching circuits that are circuits including the switching elements (the circuit including the first switching elements 68A and the circuit including the second switching elements 68B). The circuit including the first switching elements 68A includes three high-potential-side switching elements 68HA and three low-potential-side switching elements 68LA. The circuit including the second switching elements 68B includes three high-potential-side switching elements 68HB and three low-potential-side switching elements 68LB.

As shown in FIG. 4, the high-potential-side switching elements 68HA and the low-potential-side switching elements 68LA are arranged between the power supply terminal connection assembly 61PC and the first motor terminal connection assembly 67CA. The high-potential-side switching elements 68HA, the low-potential-side switching elements 68LA, the power supply terminal connection assembly 61PC, and the first motor terminal connection assembly 67CA are disposed in the order of the power supply terminal connection assembly 61PC, the high-potential-side switching elements 68HA, the low-potential-side switching elements 68LA, and the first motor terminal connection assembly 67CA.

As shown in FIG. 4, the high-potential-side switching elements 68HB and the low-potential-side switching elements 68LB are arranged between the power supply terminal connection assembly 61PC and the second motor terminal connection assembly 67CB. The high-potential-side switching elements 68HB, the low-potential-side switching elements 68LB, the power supply terminal connection assembly 61PC, and the second motor terminal connection assembly 67CB are preferably arranged in the order of the power supply terminal connection assembly 61PC, the high-potential-side switching elements 68HB, the low-potential-side switching elements 68LB, and the second motor terminal connection assembly 67CB.

As shown in FIG. 4, the motor circuits (the first motor circuit 60MA and the second motor circuit 60MB) preferably further include the motor current cut-off circuits (the first motor current cut-off circuit 65A and the second motor current cut-off circuit 65B).

As shown in FIG. 4, the first motor current cut-off circuit 65A preferably includes three current cut-off switching elements. The current cut-off switching elements are arranged between the power supply terminal connection assembly 61PC and the first motor terminal connection assembly 67CA. The current cut-off switching elements included in the first motor current cut-off circuit 65A, the high-potential-side switching elements 68HA, the low-potential-side switching elements 68LA, the power supply terminal connection assembly 61PC, and the first motor terminal connection assembly 67CA are disposed in the order of the power supply terminal connection assembly 61PC, the high-potential-side switching elements 68HA, the low-potential-side switching elements 68LA, the current cut-off switching elements, and the first motor terminal connection assembly 67CA.

As shown in FIG. 4, the second motor current cut-off circuit 65B preferably includes three current cut-off switching elements. The current cut-off switching elements are arranged between the power supply terminal connection assembly 61PC and the second motor terminal connection assembly 67CB. The current cut-off switching elements included in the second motor current cut-off circuit 65B, the high-potential-side switching elements 68HB, the low-potential-side switching elements 68LB, the power supply terminal connection assembly 61PC, and the second motor terminal connection assembly 67CB are preferably disposed in the order of the power supply terminal connection assembly 61PC, the high-potential-side switching elements 68HB, the low-potential-side switching elements 68LB, the current cut-off switching elements, and the second motor terminal connection assembly 67CB.

The motor circuits (the first motor circuit 60MA and the second motor circuit 60MB) further include the current detection circuits (the first current detection circuit and the second current detection circuit).

As shown in FIG. 4, the first current detection circuit includes three first shunt resistors 69A as the current detection elements. The first shunt resistors 69A as the current detection elements are arranged between the power supply terminal connection assembly 61PC and the first motor terminal connection assembly 67CA. The first shunt resistors 69A as the current detection elements, the current cut-off switching elements of the first motor current cut-off circuit 65A, the high-potential-side switching elements 68HA, the low-potential-side switching elements 68LA, the power supply terminal connection assembly 61PC, and the first motor terminal connection assembly 67CA are disposed in the order of the power supply terminal connection assembly 61PC, the high-potential-side switching elements 68HA, the low-potential-side switching elements 68LA, the first shunt resistors 69A as the current detection elements, the current cut-off switching elements of the first motor current cut-off circuit 65A, and the first motor terminal connection assembly 67CA.

As shown in FIG. 4, the second current detection circuit preferably includes three second shunt resistors 69B as the current detection elements. The second shunt resistors 69B as the current detection elements are arranged between the power supply terminal connection assembly 61PC and the second motor terminal connection assembly 67CB. The second shunt resistors 69B as the current detection element, the current cut-off switching elements of the second motor current cut-off circuit 65B, the high-potential-side switching elements 68HB, the low-potential-side switching elements 68LB, the power supply terminal connection assembly 61PC, and the second motor terminal connection assembly 67CB are disposed in the order of the power supply terminal connection assembly 61PC, the high-potential-side switching elements 68HB, the low-potential-side switching elements 68LB, the second shunt resistors 69B as the current detection elements, the current cut-off switching elements of the second motor current cut-off circuit 65B, and the second motor terminal connection assembly 67CB.

Features of the above-described preferred embodiments and the modifications thereof may be combined appropriately as long as no conflict arises.

The preferred embodiment of this disclosure may be widely used in an electric power steering apparatus, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board provided on one side of a motor in a direction in which a shaft extends to control the motor, the motor including three or more phases and a stator including at least a first winding and a second winding, a rotor rotatable relative to the stator, and the shaft rotatable with the rotor, the circuit board comprising:
   a power supply terminal connection assembly to which current is supplied from an external power supply;
   a first motor circuit that generates current to be supplied to the first winding from the current supplied to the power supply terminal connection assembly;
   a first motor terminal connection assembly that supplies the current generated by the first motor circuit to the first winding;
   a second motor circuit that generates current to be supplied to the second winding from the current supplied to the power supply terminal connection assembly;
   a second motor terminal connection assembly that supplies the current generated by the second motor circuit to the second winding;
   a first region in which the first motor circuit and the first motor terminal connection assembly are located; and
   a second region in which the second motor circuit and the second motor terminal connection assembly are located; wherein
   the power supply terminal connection assembly is located in the first region or the second region on a side of one end portion of a border line between the first region and the second region; and
   the first motor terminal connection assembly and the second motor terminal connection assembly are located on a side of another end portion of the border line.

2. The circuit board according to claim 1, wherein the first motor circuit includes at least a switching circuit;
   the switching circuit includes at least three high-potential-side switching elements and at least three low-potential-side switching elements;
   the high-potential-side switching elements and the low-potential-side switching elements are located between the power supply terminal connection assembly and the first motor terminal connection assembly; and
   the high-potential-side switching elements, the low-potential-side switching elements, the power supply terminal connection assembly, and the first motor terminal connection assembly are disposed in order of the power supply terminal connection assembly, the high-potential-side switching elements, the low-potential-side switching elements, and the first motor terminal connection assembly.

3. The circuit board according to claim 2, wherein
   the first motor circuit includes a motor current cut-off circuit;
   the motor current cut-off circuit includes at least three current cut-off switching elements;
   the current cut-off switching elements are located between the power supply terminal connection assembly and the first motor terminal connection assembly; and
   the current cut-off switching elements, the high-potential-side switching elements, the low-potential-side switching elements, the power supply terminal connection assembly, and the first motor terminal connection assembly are disposed in order of the power supply terminal connection assembly, the high-potential-side switching elements, the low-potential-side switching elements, the current cut-off switching elements, and the first motor terminal connection assembly.

4. The circuit board according to claim 2, wherein:
   the first motor circuit further includes a current detection circuit;
   the current detection circuit includes a current detection element;

the current detection element is located between the power supply terminal connection assembly and the first motor terminal connection assembly; and the current detection element, the high-potential-side switching elements, the low-potential-side switching elements, the power supply terminal connection assembly, and the first motor terminal connection assembly are disposed in order of the power supply terminal connection assembly, the high-potential-side switching elements, the low-potential-side switching elements, the current detection element, and the first motor terminal connection assembly.

5. The circuit board according to claim 3, wherein
the first motor circuit further includes a current detection circuit;
the current detection circuit includes a current detection element;
the current detection element is located between the power supply terminal connection assembly and the first motor terminal connection assembly; and
the current detection element, the current cut-off switching elements, the high-potential-side switching elements, the low-potential-side switching elements, the power supply terminal connection assembly, and the first motor terminal connection assembly are disposed in order of the power supply terminal connection assembly, the high-potential-side switching elements, the low-potential-side switching elements, the current detection element, the current cut-off switching elements, and the first motor terminal connection assembly.

6. The circuit board according to claim 2, wherein
the at least three high-potential-side switching elements are disposed along a second direction orthogonally intersecting with a first direction that is a direction in which the border line extends; and
the at least three low-potential-side switching elements are disposed along the second direction.

7. The circuit board according to claim 3, wherein the at least three current cut-off switching elements are disposed along a second direction orthogonally intersecting with a first direction that is a direction in which the border line extends.

8. The circuit board according to claim 4, wherein
the current detection circuit includes at least three of the current detection elements; and
the at least three current detection elements are disposed along a second direction orthogonally intersecting with a first direction that is a direction in which the border line extends.

9. The circuit board according to claim 5, wherein
the current detection circuit includes at least three of the current detection elements; and
the at least three current detection elements are disposed along a second direction orthogonally intersecting with a first direction that is a direction in which the border line extends.

10. The circuit board according to claim 1, further comprising a ground terminal connection assembly, wherein the power supply terminal connection assembly or the ground terminal connection assembly extends across the first region and the second region.

11. The circuit board according to claim 1, further comprising a ground terminal connection assembly; wherein
one of the power supply terminal connection assembly and the ground terminal connection assembly is located in one of the first region and the second region; and
another of the power supply terminal connection assembly and the ground terminal connection assembly is located in another of the first region and the second region.

12. The circuit board according to claim 10, wherein the circuit board includes a plurality of the power supply terminal connection assemblies and a plurality of the ground terminal connection assemblies.

13. The circuit board according to claim 11, wherein the circuit board includes a plurality of the power supply terminal connection assemblies and a plurality of the Ground terminal connection assemblies.

14. The circuit board according to claim 1, further comprising:
a first signal terminal connection assembly; and
a second signal terminal connection assembly, wherein
one of the first signal terminal connection assembly and the second signal terminal connection assembly is located in one of the first region and the second region;
another of the first signal terminal connection assembly and the second signal terminal connection assembly is located in another of the first region and the second region; and
the first signal terminal connection assembly and the second signal terminal connection assembly face each other across the border line.

15. A motor driving apparatus, comprising:
the circuit board according to claim 1; and
a computer that controls at least the first motor circuit and the second motor circuit.

16. A motor driving apparatus, comprising:
the circuit board according to claim 2; and
a computer that controls at least the first motor circuit and the second motor circuit.

17. A motor driving apparatus, comprising:
the circuit board according to claim 3; and
a computer that controls at least the first motor circuit and the second motor circuit.

18. A motor driving apparatus, comprising:
the circuit board according to claim 4; and
a computer that controls at least the first motor circuit and the second motor circuit.

19. A motor driving apparatus, comprising:
the circuit board according to claim 5; and
a computer that controls at least the first motor circuit and the second motor circuit.

20. An electric power steering apparatus that assists a handle operation of a driver, the electric power steering apparatus comprising:
a torque sensor that detects a torque due to the handle operation;
the motor driving apparatus according to claim 15; and
the motor driven by the motor driving apparatus.

* * * * *